United States Patent
King et al.

(10) Patent No.: US 12,249,662 B2
(45) Date of Patent: Mar. 11, 2025

(54) SEMICONDUCTOR DEVICE, MANUFACTURING METHOD THEREOF, AND DETECTING METHOD USING THE SAME

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Ya-Chin King, Taipei (TW); Chrong Jung Lin, Hsinchu (TW); Burn Jeng Lin, Hsinchu (TW); Shi-Jiun Wang, Changhua (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 372 days.

(21) Appl. No.: 17/749,382

(22) Filed: May 20, 2022

(65) Prior Publication Data
US 2023/0378377 A1 Nov. 23, 2023

(51) Int. Cl.
*H01L 31/02* (2006.01)
*H01J 37/244* (2006.01)
*H01L 31/18* (2006.01)

(52) U.S. Cl.
CPC ...... *H01L 31/02005* (2013.01); *H01J 37/244* (2013.01); *H01L 31/186* (2013.01)

(58) Field of Classification Search
CPC ............. H01L 31/02005; H01L 31/186; H01L 31/115; H01J 37/244
See application file for complete search history.

(56) References Cited

U.S. PATENT DOCUMENTS

| | | |
|---|---|---|
| 8,796,666 B1 | 8/2014 | Huang et al. |
| 8,945,803 B2 | 2/2015 | Chen et al. |
| 8,987,689 B2 | 3/2015 | Chen et al. |
| 9,093,530 B2 | 7/2015 | Huang et al. |
| 9,269,537 B2 | 2/2016 | Tseng et al. |
| 9,305,799 B2 | 4/2016 | Chen et al. |
| 9,336,993 B2 | 5/2016 | Yu |
| 9,367,661 B2 | 6/2016 | Jou et al. |
| 9,529,959 B2 | 12/2016 | Wang et al. |
| 9,548,303 B2 | 1/2017 | Lee et al. |
| 2016/0211390 A1* | 7/2016 | Chen ................ H01L 31/02005 |

* cited by examiner

*Primary Examiner* — Ermias T Woldegeorgis
(74) *Attorney, Agent, or Firm* — Birch, Stewart, Kolasch & Birch, LLP

(57) ABSTRACT

A device includes a detector, a sensing pad, a ring structure, a control circuit, a first transistor, and a second transistor. The sensing pad is electrically connected to the detector. The ring structure is over the sensing pad and includes an upper conductive ring and a lower conductive ring between the upper conductive ring and the sensing pad. The first transistor interconnects the upper conductive ring and the control circuit. The second transistor interconnects the lower conductive ring and the control circuit.

20 Claims, 13 Drawing Sheets

SEMICONDUCTOR DEVICE, MANUFACTURING METHOD THEREOF, AND DETECTING METHOD USING THE SAME

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As the size has decreased, maintaining the reliability in patterning processes and the yields produced by the patterning processes has become more difficult. In some cases, the use of optical proximity correction and the adjustment of lithography parameters such as the duration of a process, the wavelength, focus, and intensity of light used can mitigate some defects. However, the current and systems for patterning material layers in semiconductor wafers has not been entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
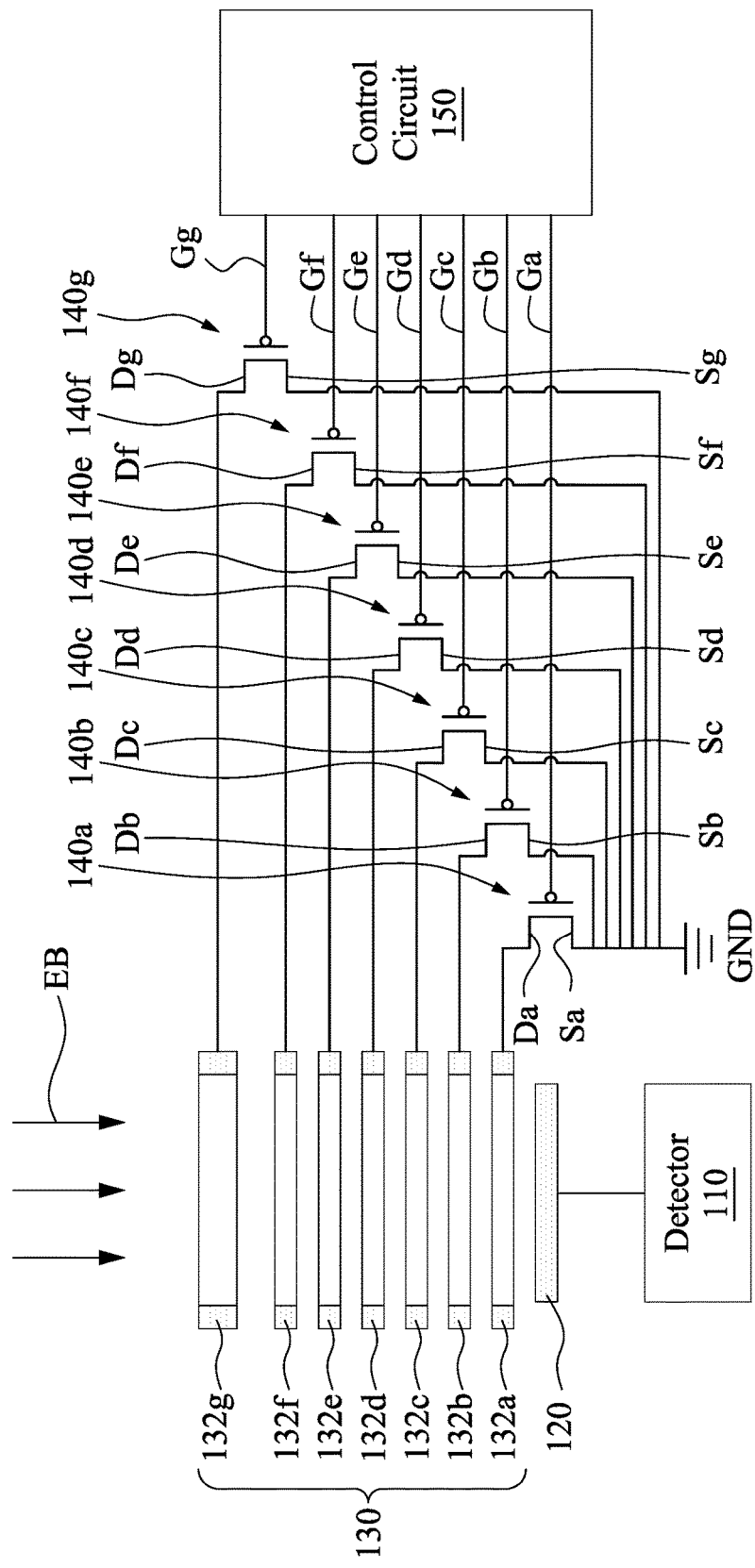
FIG. 1 is a circuit diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to semiconductor device, methods of forming the same, and methods of using the same. More particularly, some embodiments of the present disclosure are related to a light detector including a ring structure for focusing light (e.g., E-beam) onto a sensing element for detecting the intensity of light.

FIG. 1 is a circuit diagram of a semiconductor device 100 in accordance with some embodiments. The semiconductor device 100 is configured to detect the intensity of light (e.g., E-beam light) EB. The semiconductor device 100 includes a detector 110, a sensing pad 120, a ring structure 130, transistors 140a, 140b, 140c, 140d, 140e, 140f, and 140g, and a control circuit 150. The detector 110 is electrically connected to the sensing pad 120 and is configured to detect the intensity of the e-beam light EB incident on the sensing pad 120. The ring structure 130 is disposed over the sensing pad 120 to focus the e-beam light EB to the sensing pad 120. As shown in FIG. 1, the ring structure 130 is electrically isolated from the sensing pad 120. That is, there is not conductive element interconnecting the ring structure 130 and the sensing pad 120.

Figure 2B:
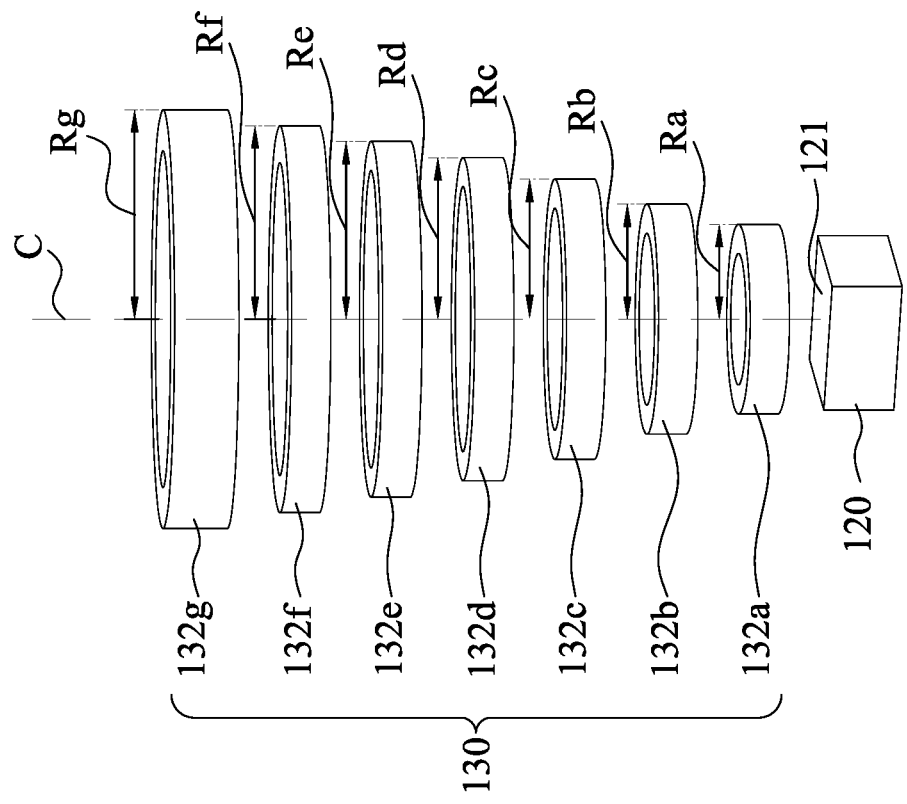
FIG. 2B is a perspective view of the ring structure and the sensing pad of the semiconductor device in FIG. 1 in accordance with some embodiments.
Figure 2A:
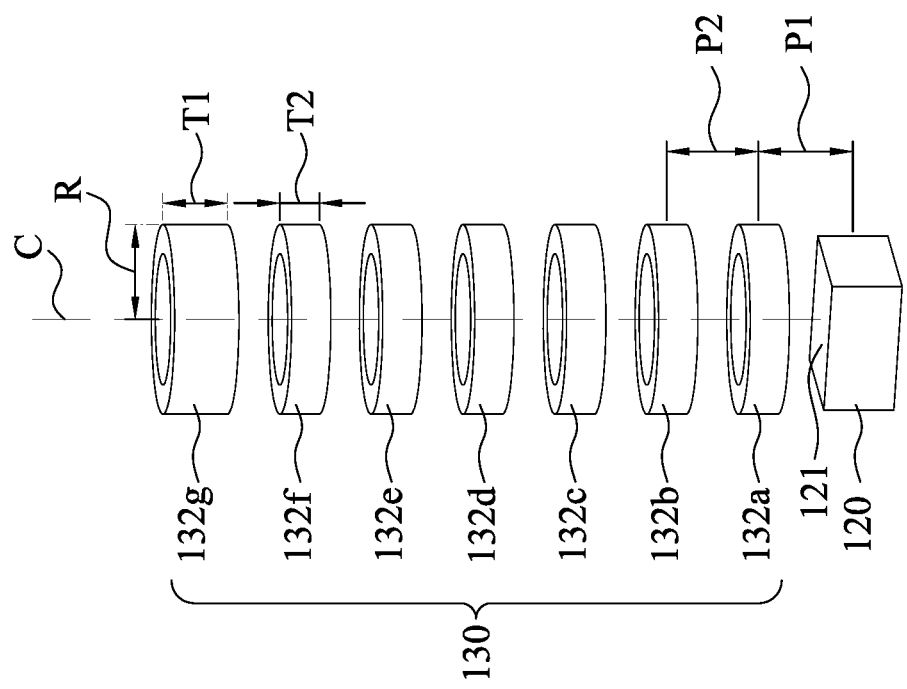
FIG. 2A is a perspective view of the ring structure and the sensing pad of the semiconductor device in FIG. 1 in accordance with some embodiments.

FIG. 2A is a perspective view of the ring structure 130 and the sensing pad 120 of the semiconductor device 100 in FIG. 1 in accordance with some embodiments. Reference is made to FIGS. 1 and 2A. The ring structure 130 includes a plurality of conductive rings 132a, 132b, 132c, 132d, 132e, 132f, and 132g electrically isolated from each other. For clarity, the conductive rings 132a-132g are shown in cross-sectional view in FIG. 1. In some embodiments, any two of the conductive rings 132a-132g are not electrically connected to each other. For example, the semiconductor device 100 further includes a dielectric structure 170 (see FIGS. 4A and 13) covering the sensing pad 120. The conductive rings 132a-132g are embedded in the dielectric structure 170, and any two of the conductive rings 132a-132g are separated from each other by the dielectric structure 170. It is noted that seven layers of the conductive rings 132a-132g are arranged as illustrated in FIGS. 1 and 2A, which is for illustrative purposes only and not intended to be limiting beyond what is specifically recited in the claims. It can be appreciated that any number of the conductive rings can be formed in the ring structure 130.

Reference is made to FIG. 1. The transistors 140a, 140b, 140c, 140d, 140e, 140f, and 140g are electrically connected to the conductive rings 132a, 132b, 132c, 132d, 132e, 132f, and 132g, respectively. Specifically, sources Sa, Sb, Sc, Sd, Se, Sf, and Sg of the transistors 140a, 140b, 140c, 140d, 140e, 140f, and 140g are electrically connected to a ground GND, and drains Da, Db, Dc, Dd, De, Df, and Dg of the transistors 140a, 140b, 140c, 140d, 140e, 140f, and 140g are electrically connected to the conductive rings 132a, 132b, 132c, 132d, 132e, 132f, and 132g, respectively. Further, gates Ga, Gb, Gc, Gd, Ge, Gf, and Gg of the transistors 140a, 140b, 140c, 140d, 140e, 140f, and 140g are electrically connected to the control circuit 150. Stated another way, the transistors 140a-140g each interconnects each of the conductive rings 132a-132g and the control circuit 150.

Figure 4:
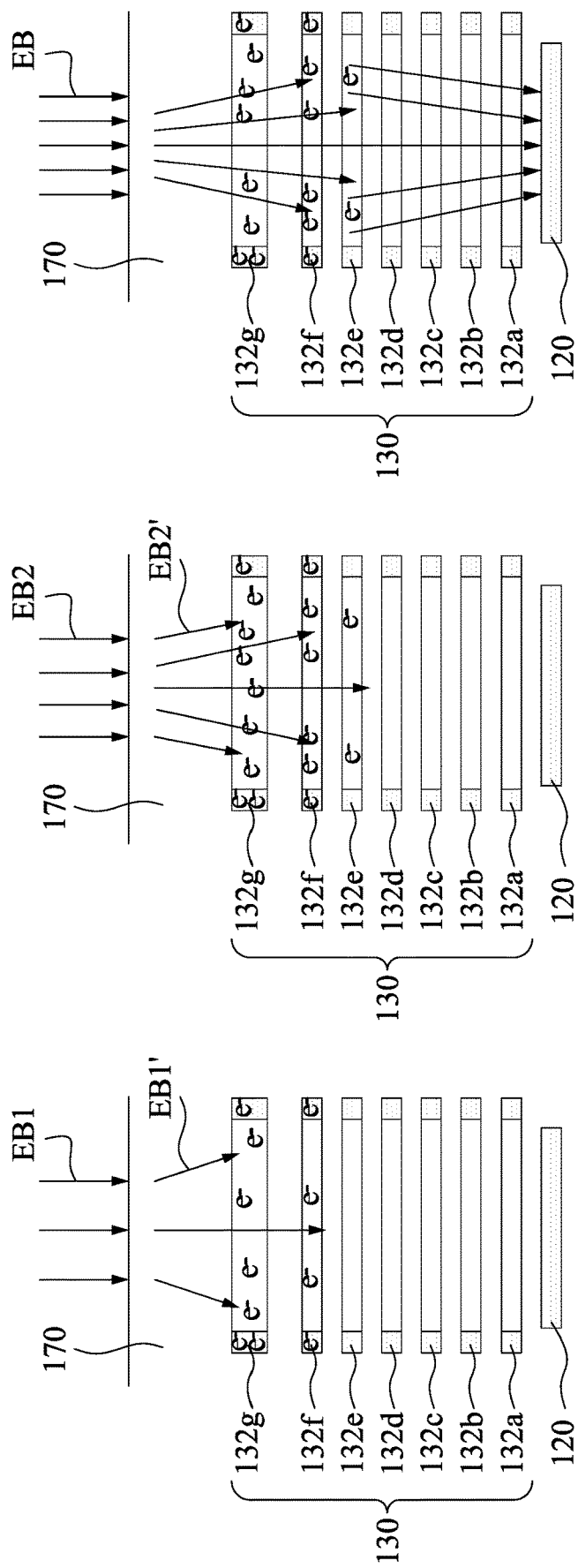
FIGS. 4A-4C are illustrative diagrams of a method for detecting e-beam light according to aspects of the present disclosure in various embodiments.

In some embodiments, the sensing pad 120 of the semiconductor device 100 is formed under the dielectric structure 170 (see FIG. 4A). When an e-beam light EB is incident on the semiconductor device 100, the dielectric structure 170 may scatter the e-beam light EB, such that electrons of the e-beam light EB may be laterally scattered in the dielectric structure 170. With the scattering effect, the e-beam light EB may not reach the sensing pad 120, and the intensity of the sensing pad 120 detected by the detector 110 may be distortion. However, in FIGS. 1 and 2A, the ring structure 130 can focus the e-beam light EB and reduce the scattering effect in the dielectric structure 170, such that the e-beam light EB can reach the sensing pad 120 and the energy loss issue can be improved.

Figure 3:
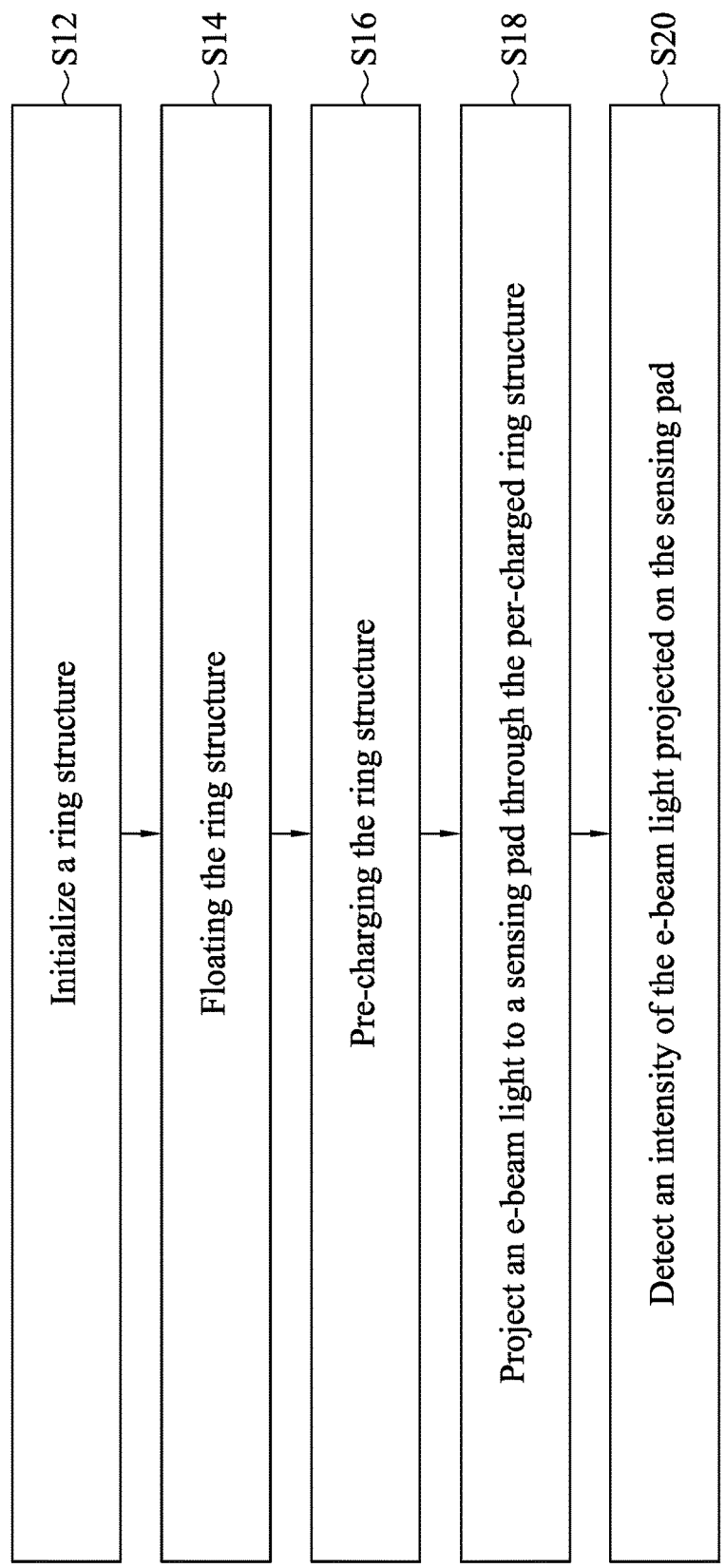
FIG. 3 is a flowchart of a method for detecting e-beam light according to aspects of the present disclosure in various embodiments.

FIG. 3 is a flowchart of a method M10 for detecting e-beam light according to aspects of the present disclosure in various embodiments. The method M10 is merely an example and is not intended to limit the present disclosure beyond what is explicitly recited in the claims. Additional operations can be provided before, during, and after the method M10, and some operations described can be replaced, eliminated, or moved around for additional embodiments of the process. For clarity and ease of explanation, some elements of the figures have been simplified.

Various operations of the method M10 are discussed in association with FIGS. 1 and 4A-4C, where FIGS. 4A-4C are illustrative diagrams of a method for detecting e-beam light according to aspects of the present disclosure in various embodiments. Throughout the various views and illustrative embodiments, like reference numbers are used to designate like elements. In operation S12 of FIG. 3, the ring structure is initialized (or grounded). In some embodiments, when the ring structure is initialized, each of the conductive rings 132a-132g is connected to the ground GND. For example, during the operation S12, the control circuit 150 provides voltages to the gates Ga-Gg of the transistors 140a-140g, such that the transistors 140a-140g are turned on and the conductive rings 132a-132g are grounded. Therefore, the operation S12 can remove the carriers in the conductive rings 132a-132g to initialize the electric potentials of the conductive rings 132a-132g. For example, after the initialization process, the conductive rings 132a-132g have substantially the same electric potential (e.g., grounded). The conductive rings 132a-132g may be substantially free of electrons/holes after the initialization process.

In operation S14 of FIG. 3, floating the ring structure. For example, during the operation S14, the control circuit 150 stops providing the voltages to the Ga-Gg of the transistors 140a-140g, such that the transistors 140a-140g are turned off and the conductive rings 132a-132g are disconnected from the ground GND. Therefore, the conductive rings 132a-132g are floating. Further, as shown in FIG. 1, since the conductive rings 132a-132g are separated from each other and there is no conductive elements interconnecting therebetween, the conductive rings 132a-132g are electrically isolated from each other.

In operation S16 of FIG. 3, pre-charging the ring structure. For example, as shown in FIG. 4A, an e-beam light EB1 with a first (low) intensity is projected (incident) to the ring structure 130. The first intensity is low such that the e-beam light EB1 may not reach the sensing pad 120. As mentioned above, after the e-beam light EB1 incident on the surface of the dielectric structure 170, the e-beam light EB1 starts to scatter in the dielectric structure 170. The scattered e-beam light EB1' may be incident on the topmost conductive ring 132g or some of the conductive rings 132a-132g, depending on the intensity of the e-beam light EB1, and the conductive ring 132g (and some of the lower conductive rings) are thus charged with electrons. That is, the conductive ring 132g (and some of the lower conductive rings) is (are) negative charged. Further, since the conductive rings 132a-132g are electrically isolated from each other, the conductive ring 132g may accommodate more electrons than the conductive ring 132f (and the lower conductive rings 132a-132e). Also, the conductive ring 132f may accommodate more electrons than the conductive ring 132e (and the lower conductive rings 132a-132d).

Optionally, after the e-beam light EB1 is projected to the ring structure 130, an e-beam light EB2 with a second (middle) intensity is projected to the ring structure 130, as shown in FIG. 4B. The second intensity of the e-beam light EB2 is greater than the first intensity of the e-beam light EB1. For example, the e-beam light EB1 and the e-beam light EB2 may be provided from the same e-beam light source but with different intensities. Similar to the e-beam light EB1, the e-beam light EB2 enters the dielectric structure 170 and thus start to scatter. The scattered e-beam light EB2' charges the topmost conductive ring 132g or some of the conductive rings 132a-132g, depending on the intensity of the e-beam light EB2, and the conductive ring 132g (and some of the lower conductive rings) are thus charged with electrons. Since the e-beam light EB2 has the second intensity that is greater than the first intensity of the e-beam light EB1, more conductive rings are negative charged, as shown in FIG. 4B. In the meantime, the scattered e-beam light EB2' provides more electrons to the conductive ring 132g (and some of the lower conductive rings). Therefore, the conductive ring 132g has more electrons than the conductive ring 132f, which has more electrons than the conductive ring 132e, and so on. Moreover, the increased electrons in the upper conductive rings (e.g., the conductive rings 132g, 132f, and 132e) generate a repulsion force against the e-beam light EB2' such that the e-beam light EB2' begins converge and the scattering effect of the e-beam light EB2' is reduced.

Optionally, another e-beam light with an intensity higher than the second intensity can be projected to the ring structure 130 after the e-beam light EB2 is projected on the ring structure 130. In some embodiments, the e-beam light source may continuously project the e-beam light to the ring structure 130 with gradually increased intensity.

In operation S18 of FIG. 3, project an e-beam light to the sensing pad through the pre-charged ring structure. For example, as shown in FIG. 4C, an e-beam light EB that is desired to be detected by the detector is projected to the ring structure. The e-beam light EB has an intensity higher than the e-beam light EB1 and EB2 that used to pre-charge the ring structure 130. As shown in FIG. 4C, since the upper conductive ring(s) (e.g., the conductive ring 132g, 132f, 132e, etc.) are negative charged, the electrons in the e-beam light EB are pushed away from the conductive rings 132g, 132f, 132e, . . . to the center of the ring structure 130. As such, the charged ring structure 130 modifies the trajectory of the e-beam light EB, and focusing the e-beam light EB to the sensing pad 120.

In operation S20 of FIG. 3, detecting an intensity of the e-beam light projected on the sensing pad. As shown in FIG. 1, the sensing pad 120 is electrically connected to the detector 110. During the operation S20, the detector is turned on and detect the intensity of the e-beam light EB projected on the sensing pad 120. As mentioned above, since the ring structure 130 focuses the e-beam light EB to the sensing pad 120, the intensity detected by the detector 110 reflects the substantially real intensity of the e-beam light EB. In some embodiments, to detect the e-beam light EB, the detector 110 is turned off until the operation S20. That is, the detector 110 is turned off during the pre-charging process, and is turned on after the pre-charging process and before or during the projection of the e-beam light EB.

Reference is made to FIGS. 1 and 2A. Centers of the conductive rings 132g-132a are directly above the sensing pad 120. That is, an axis C of each of the conductive rings 132g-132a passes through a sensing surface 121 of the sensing pad 120. Therefore, the conductive rings 132g-132a can focus the e-beam light to the sensing surface 121 of the sensing pad 120. In some embodiments, the conductive rings 132g-132a have substantially the same axis C. In some other embodiments, the axes of the conductive rings 132g-132a may be slighted misaligned with each other due to, for example, the manufacturing tolerance.

In some embodiment, the topmost conductive ring 132g has a thickness T1 greater than a thickness T2 (or thicknesses) of the lower conductive ring(s) (e.g., the conductive ring 132a-132f). The thicker conductive ring 132g stores more electrons and thus provides higher repulsive force to the e-beam light EB to modify the scattering trajectory of the e-beam light EB significantly. In some embodiments, the conductive rings 132a-132f have substantially the same thickness.

In some embodiments, the ring structure 130 (and the sensing pad 120) are formed in the multilayer interconnection (MLI) structure, such that the conductive rings 132a-132g (and the sensing pad 120) are formed in different (and adjacent) levels of the metallization layers (e.g., level M0, M1, M2, etc.). For example, a distance (or pitch) P1 between the conductive ring 132a and the sensing pad 120 is substantially the same as a distance (or pitch) P2 between the conductive rings 132a and 132b. Similarly, the conductive rings 132a-132b, the conductive rings 132b-132c, the conductive rings 132c-132d, the conductive rings 132d-132e, and the conductive rings 132e-132f may have substantially the same distance (or pitch). On the other hand, the conductive rings 132f-132g may have a distance greater than the distance P1 (P2).

The radii R of the conductive rings 132a-132g depends on several parameters. For example, the radius R of the topmost conductive ring 132g is related to a distance between the topmost conductive ring 132g and the top surface of the dielectric structure 170. The topmost conductive ring 132g may have a small radius R if the topmost conductive ring 132g is near the top surface of the dielectric structure 170, and the topmost conductive ring 132g may have a large radius R if the topmost conductive ring 132g is far away from the top surface of the dielectric structure 170 since the scattering angle of the e-beam light is increased with increased depth in the dielectric structure 170.

In some embodiments, the conductive rings 132a-132g have the same radii R as shown in FIG. 2A. In some embodiments, the conductive rings 132a-132g have different radii as shown in FIG. 2B, which is a perspective view of the ring structure and the sensing pad of the semiconductor device in FIG. 1 in accordance with some embodiments. For example, the radius Rg of the conductive ring 132g is greater than the radius Rf of the conductive ring 132f, and/or the radius Rf of the conductive ring 132f is greater than the radius Re of the conductive ring 132e, and/or the radius Re of the conductive ring 132e is greater than the radius Rd of the conductive ring 132d, and/or the radius Rd of the conductive ring 132d is greater than the radius Rc of the conductive ring 132c, and/or the radius Rc of the conductive ring 132c is greater than the radius Rb of the conductive ring 132b, and/or the radius Rb of the conductive ring 132b is greater than the radius Ra of the conductive ring 132a. Therefore, the ring structure 130 can converge the e-beam light to a small beam size (or diameter).

In some embodiments, a layout area (i.e., $2*pi*(Ra)^2$) of the bottommost conductive ring 132a is related to the area of the sensing surface 121 of the sensing pad 120. For example, a ratio of the layout area of the bottommost conductive ring 132a to the area of the sensing surface 121 is in a range between about 1 and about 5. If the ratio is greater than about 5, the focused e-beam light EB may have a beam size greater than the area of the sensing surface 121, such that the sensing pad 120 may not collect the whole e-beam light EB. If the ratio is less than about 1, it may waste the area usage of the sensing surface 121.

In some embodiments, a layout area of an upper conductive ring is related to a layout area of an adjacent lower conductive ring. Take the adjacent conductive rings 132g and 132f as example, a ratio of the layout area (i.e., $2*pi*(Rg)^2$) of the conductive ring 132g to the layout area (i.e., $2*pi*(Rf)^2$) of the conductive ring 132f is in a range between about 1 and about 5. If the ratio is greater than about 5, the e-beam light EB passing through the conductive ring 132g may have a beam size greater than the layout area of the conductive ring 132f, such that the e-beam light EB may hit the conductive ring 132f and results in intensity loss. If the ratio is less than about 1, the conductive ring 132f may not be effectively charged during the pre-charging process and may not provide enough repulsive force against the e-beam light EB.

Figure 5:
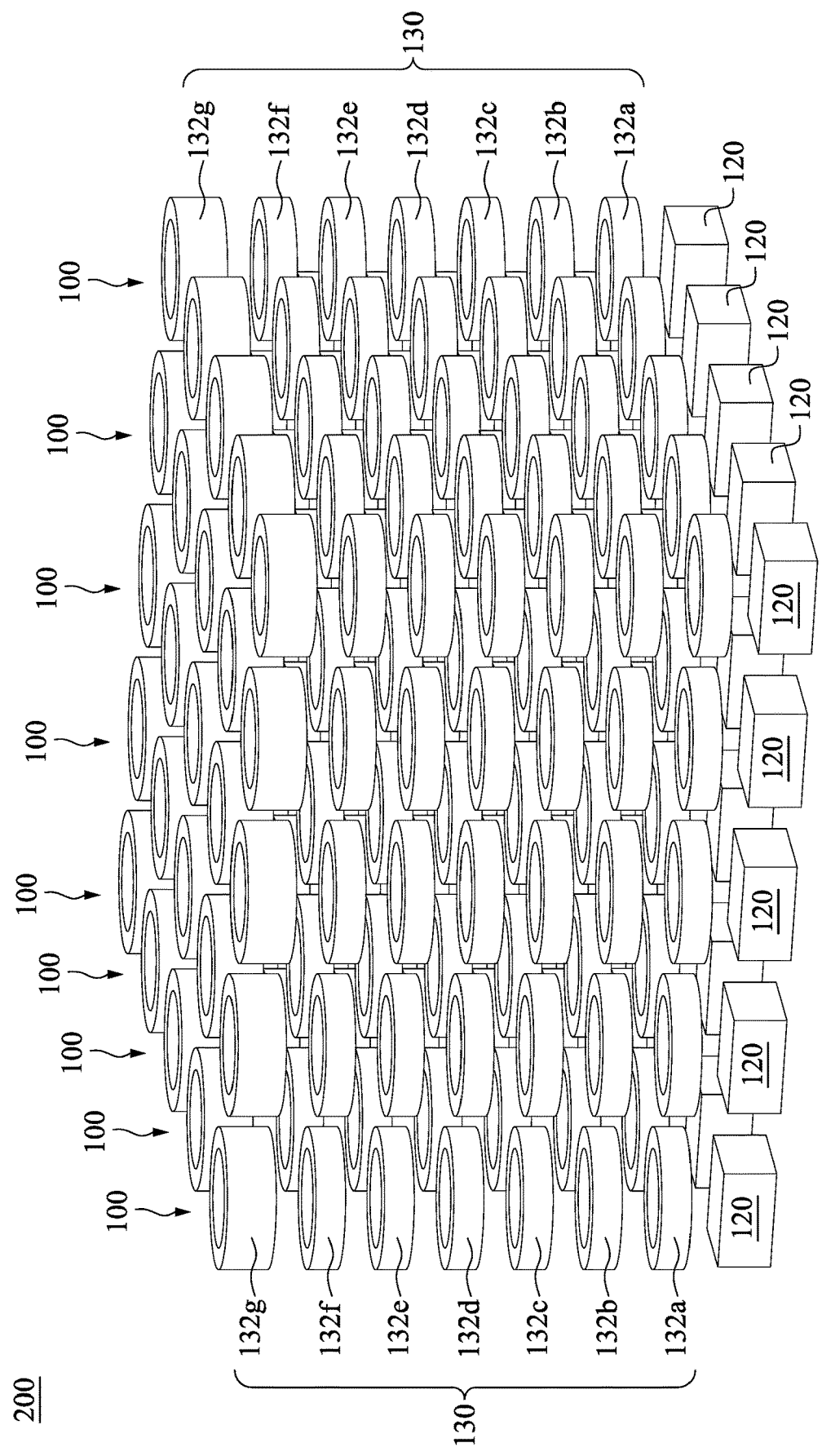
FIG. 5 is a perspective view of a semiconductor device in accordance with some embodiments.

FIG. 5 is a perspective view of a semiconductor device 200 in accordance with some embodiments. For clarity, FIG. 5 only illustrates the sensing pads 120 and the ring structures 130 of the semiconductor device 200. In some embodiments, the semiconductor device 200 includes a plurality of the semiconductor device 100 of FIG. 1. In greater detail, the sensing pads 120 and the ring structures 130 of the semiconductor device 100 in FIG. 2A can be arranged as an array. That is, a plurality of the sensing pads 120 and the ring structures 130 can be arranged in an X-direction and/or a Y-direction. With such configuration, the semiconductor device 200 can detect the electron distribution of the e-beam light in the XY-directions simultaneously. Further, each conductive rings are not electrically connected to each other. For example, the conductive ring 132g is electrically isolated from the adjacent conductive rings 132g. Hence, the conductive rings 132a-132g can individually accommodate its own electrons during the pre-charging process. Other relevant structural details of the semiconductor device 200 are substantially the same as or similar to the semiconductor device 100 in FIG. 1, and, therefore, a description in this regard will not be repeated hereinafter.

Figure 6:
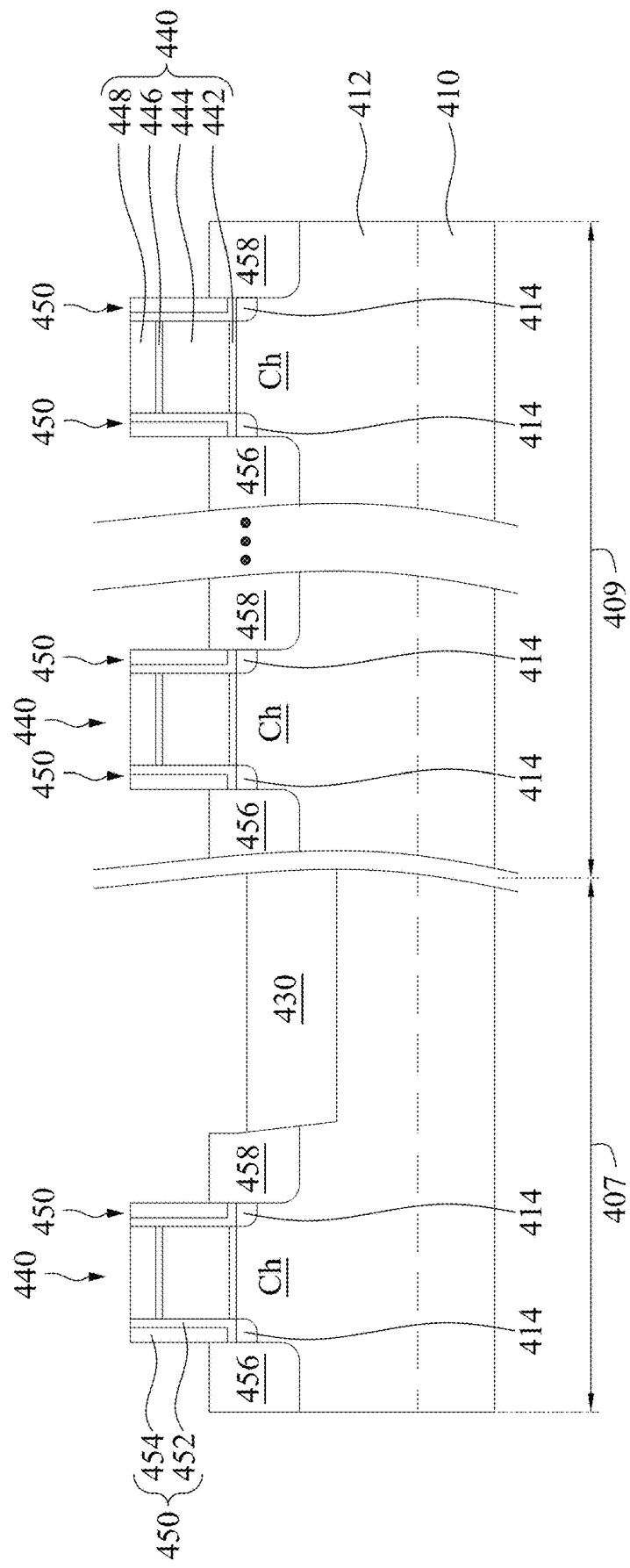
FIGS. 6-13 illustrate a method for manufacturing a semiconductor device at various stages in accordance with some embodiments of the present disclosure.

FIGS. 6-13 illustrate a method for manufacturing a semiconductor device at various stages in accordance with some embodiments of the present disclosure. Reference is made to FIG. 6. A substrate 410 is provided. The substrate 410 has a sensing region 407 and a circuit region 409. In some embodiments, the substrate 410 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 410 may include an epitaxial layer (epi-layer), which may be strained for performance enhancement, and/or may include a silicon-on-insulator (SOI) structure.

One or more semiconductor fins (or active regions) 420 are formed on the substrate 410. The semiconductor fins 420 may be P-type or N-type. For example, each of the semiconductor fins 420 include a well region 412 which is P-type or N-type. The semiconductor fins 420 may be formed using, for example, a patterning process to form trenches such that trenches are formed between adjacent semiconductor fins 420. As discussed in greater detail below, the semiconductor fins 420 will be used to form FinFETs.

Isolation structures 430, such as shallow trench isolations (STI), are disposed in the substrate 410. The isolation structures 430 can be equivalently referred to as an isolation insulating layer in some embodiments. The isolation structures 430 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 430 are formed through a process such as CVD, flowable CVD (FCVD), or a spin-on-glass process, although any acceptable process may be utilized. Subsequently, portions of the isolation structures 430 extending over the top surfaces of the semiconductor fins 420, are removed using, for example, an etching back process, chemical mechanical polishing (CMP), or the like.

The isolation structures 430 are then recessed to expose an upper portion of the semiconductor fin 420. In some embodiments, the isolation structures 430 are recessed using a single etch processes, or multiple etch processes. In some embodiments in which the isolation structures 430 is made of silicon oxide, the etch process may be, for example, a dry etch, a chemical etch, or a wet cleaning process. For example, the chemical etch may employ fluorine-containing chemical such as dilute hydrofluoric (dHF) acid.

After the semiconductor fins 420 and the isolation structures 430 are formed, dummy gate structures 440 are formed over the substrate 410 and at least partially disposed over the semiconductor fins 420. The portions of the semiconductor fins 420 underlying the dummy gate structures 440 may be referred to as the channel regions Ch, and the semiconductor fins 420 may be referred to as channel layers. The dummy gate structures 440 may also define source/drain regions of the semiconductor fins 420, for example, the regions of the semiconductor fins 420 adjacent and on opposing sides of the channel regions Ch.

Dummy gate formation operation first forms a dummy gate dielectric layer over the semiconductor fins 420. Subsequently, a dummy gate electrode layer and a hard mask which may include multiple layers (e.g., an oxide layer and a nitride layer) are formed over the dummy gate dielectric layer. The hard mask is then patterned to be a nitride mask layer 448 and an oxide mask layer 446, followed by patterning the dummy gate electrode layer to be a dummy gate electrode 444 by using the nitride mask layer 448 and the oxide mask layer 446 as etch masks. In some embodiments, after patterning the dummy gate electrode layer, the dummy gate dielectric layer is removed from the S/D regions of the semiconductor fins 420 and to be a dummy gate dielectric layer 442. The etch process may include a wet etch, a dry etch, and/or combinations thereof. The etch process is chosen to selectively etch the dummy gate dielectric layer without substantially etching the semiconductor fins 420, the dummy gate electrode layer 444, the oxide mask layer 446, and the nitride mask layer 448.

In some embodiments, lightly-doped-drain (LDD) source/drain regions 414 are formed in the source/drain portions of the semiconductor fins 420. For example, at least one implantation process is performed, such that dopants are implanted in the source/drain portions of the semiconductor fins 420 to form the LDD source/drain regions 414. The dummy gate structures 440 act as a mask for the ion implantation.

After formation of the dummy gate structures 440 (or formation of the LDD source/drain regions 414) is completed, gate spacers 450 are formed on sidewalls of the dummy gate structures 440. In some embodiments of the gate spacer formation operations, a spacer material layer is deposited on the substrate 410. The spacer material layer may be a conformal layer that is subsequently etched back to form the gate spacers 450. In some embodiments, the spacer material layer includes multiple layers, such as a first spacer layer 452 and a second spacer layer 454 formed over the first spacer layer 452. The first and second spacer layers 452 and 454 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 452 and 454 may be formed by depositing in sequence two different dielectric materials over the dummy gate structure 540 using processes such as, an ALD process, a PEALD (plasma enhanced ALD) process, a PECVD process, a subatmospheric CVD (SACVD) process, or other suitable process. An anisotropic etching process is then performed on the first and second spacer layers 452 and 454 to expose portions of the semiconductor fins 420 not covered by the dummy gate structures 440 (e.g., in the source/drain regions of the semiconductor fins 420).

Portions of the first and second spacer layers 452 and 454 directly above the dummy gate structures 440 may be removed by this anisotropic etching process. Portions of the first and second spacer layers 452 and 454 on sidewalls of the dummy gate structures 440 may remain, forming gate sidewall spacers, which are denoted as the gate spacers 450, for the sake of simplicity. In some embodiments, the first spacer layer 452 is formed of silicon oxide that has a lower dielectric constant than silicon nitride, and the second spacer layer 454 is formed of silicon nitride that has a higher etch resistance against subsequent etching processing (e.g., etching source/drain recesses in the semiconductor fins 420) than silicon oxide. In some embodiments, the gate spacers 450 may be used to offset subsequently formed doped regions, such as source/drain regions. The gate spacers 450 may further be used for designing or modifying the source/drain region profile.

After the formation of the gate spacers 450 is completed, source/drain epitaxial structures 456 and 458 are formed on source/drain regions of the semiconductor fins 420 that are not covered by the dummy gate structures 440 and the gate spacers 450. In some embodiments, formation of the source/drain epitaxial structures 456 and 458 includes recessing source/drain regions of the semiconductor fins 420, followed by epitaxially growing semiconductor materials in the recessed source/drain regions of the semiconductor fins 420.

The source/drain regions of the semiconductor fins 420 can be recessed using suitable selective etching processing that attacks the semiconductor fins 420, but barely attacks the gate spacers 450 and the mask layer 448 of the dummy gate structures 440. For example, recessing the semiconductor fins 420 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 420 at a faster etch rate than it etches the gate spacers 450 and the mask layers 448 of the dummy gate structures 440. In some other embodiments, recessing the semiconductor fin 420 may be performed by a wet chemical etch, such as ammonium peroxide mixture (APM), $NH_4OH$, tetramethylammonium hydroxide (TMAH), combinations thereof, or the like, which etches the semiconductor fins 420 at a faster etch rate than it etches the gate spacers 450 and the mask layers 448 of the dummy gate structures 440. In some other embodiments, recessing the semiconductor fins 420 may be performed by a combination of a dry chemical etch and a wet chemical etch.

Once recesses are created in the source/drain regions of the semiconductor fins 420, the source/drain epitaxial structures 456 and 458 are formed in the source/drain recesses in the semiconductor fins 420 by using one or more epitaxy or epitaxial (epi) processes that provides one or more epitaxial materials on the semiconductor fins 420. During the epitaxial growth process, the gate spacers 450 limit the one or more epitaxial materials to source/drain regions in the semiconductor fins 420. In some embodiments, the lattice constants of the source/drain epitaxial structures 456 and 458 are different from the lattice constant of the semiconductor fins 420, so that the channel region in the semiconductor fins 420 and between the source/drain epitaxial structures 456 and 458 can be strained or stressed by the source/drain epitaxial structures 456 and 458 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 420.

In some embodiments, the source/drain epitaxial structures 456 and 458 include Ge, Si, GaAs, AlGaAs, SiGe, GaAsP, SiP, or other suitable material. The source/drain epitaxial structures 456 and 458 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 456 and 458 are not in-situ doped, an implantation process (i.e., a junction implant process) is performed to dope the source/drain epitaxial structures 456 and 458.

Once the source/drain epitaxial structures 456 and 458 are formed, an annealing process can be performed to activate the dopants in the source/drain epitaxial structures 456 and 458. The annealing process may be, for example, a rapid thermal anneal (RTA), a laser anneal, a millisecond thermal annealing (MSA) process or the like.

Figure 7:
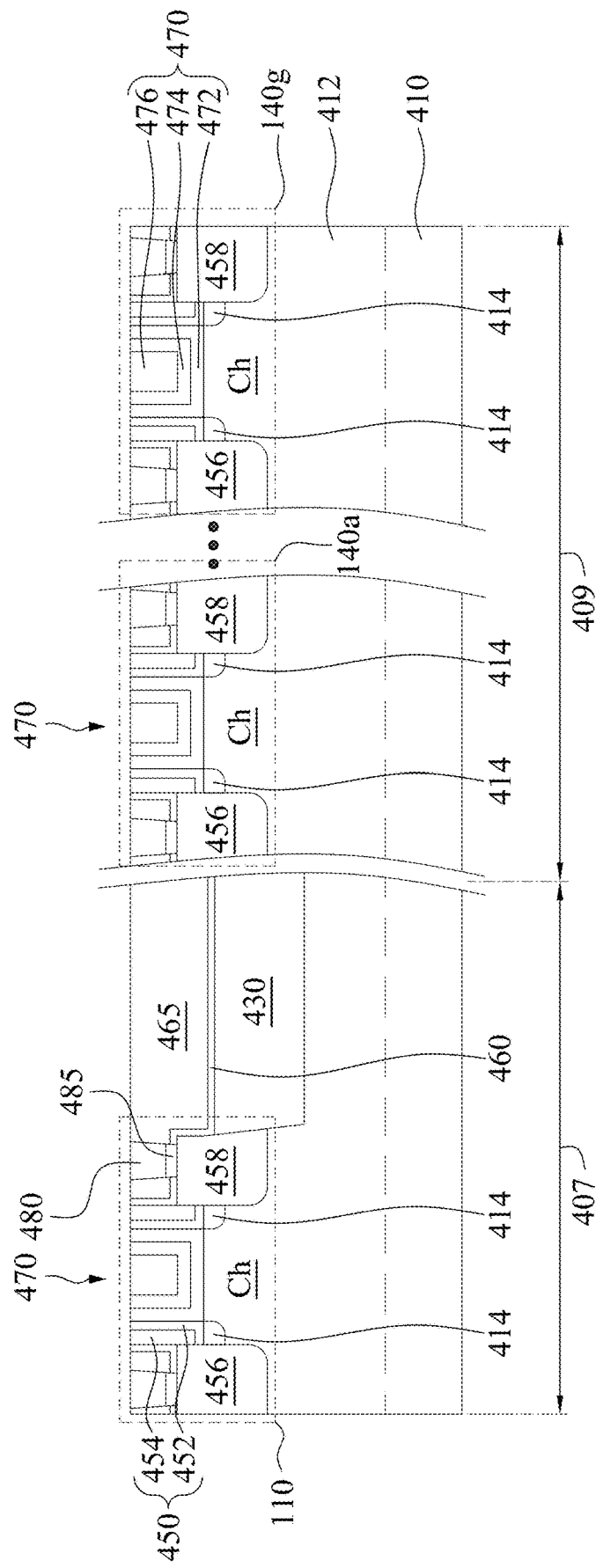

Reference is made to FIG. 7. An interlayer dielectric (ILD) layer 465 is formed on the substrate 410. In some embodiments, a contact etch stop layer (CESL) 460 is also formed prior to forming the ILD layer 465. In some embodiments, the CESL 460 includes a silicon nitride layer, a silicon oxynitride layer, and/or other suitable materials having a different etch selectivity than the ILD layer 465. The CESL 460 may be formed by plasma-enhanced chemical vapor deposition (PECVD) process and/or other suitable deposition or oxidation processes. In some embodiments, the ILD layer 465 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 460. The ILD layer 465 may be deposited by a subatmospheric CVD (SACVD) process, a flowable CVD process, or other suitable deposition technique. In some embodiments, after formation of the ILD layer 465, the wafer may be subject to a high thermal budget process to anneal the ILD layer 465.

In some examples, after forming the ILD layer 465, a planarization process may be performed to remove excessive materials of the ILD layer 465. For example, a planarization process includes a chemical mechanical planarization (CMP) process which removes portions of the ILD layer 465 (and the CESL 460, if present) overlying the dummy gate structure 440. In some embodiments, the CMP process also removes the oxide mask layers 446 and the nitride mask layers 448 (as shown in FIG. 6) and exposes the dummy gate electrodes 444 (as shown in FIG. 6).

The dummy gate electrodes 444 and the dummy gate dielectric layers 442 (see FIG. 6) are removed, resulting in a gate trench between the gate spacers 450. The dummy gate electrodes 444 and the dummy gate dielectric layers 442 are removed using a selective etching process (e.g., selective dry etching, selective wet etching, or combinations thereof) that etches materials in the dummy gate electrode 444 and the dummy gate dielectric layer 442 at a faster etch rate than it etches other materials (e.g., the gate spacers 450, the CESL 460, and/or the ILD layer 465).

Thereafter, replacement gate structures 470 are formed in the gate trenches. The gate structures 470 may be the final gates of FinFETs. The final gate structure may be a high-k/metal gate stack, however other compositions are possible. In some embodiments, the gate structures 470 form the gate associated with the three-sides of the channel region provided by the semiconductor fins 420. Stated another way, the gate structure 470 wraps around the semiconductor fin 420 on three sides. In various embodiments, each of the (high-k/metal) gate structure 470 includes a gate dielectric layer 472 lining the gate trench and a gate electrode over the gate dielectric layer 472. The gate electrode may include a work function metal layer 474 formed over the gate dielectric layer 472 and a fill metal 476 formed over the work function metal layer 474 and filling a remainder of gate trenches. The gate dielectric layer 472 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 474 and/or fill metal 476 used within the high-k/metal gate structure 470 may include a metal, metal alloy, or metal silicide. Formation of the high-k/metal gate structures 470 may include multiple deposition processes to form various gate materials, one or more liner layers, and one or more CMP processes to remove excessive gate materials.

In some embodiments, the interfacial layer of the gate dielectric layer 472 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 472 may include hafnium oxide ($HfO_2$). Alternatively, the gate dielectric layer 472 may include other high-k dielectrics, such as hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 474 may include work function metals to provide a suitable work function for the high-k/metal gate structure 470. For an n-type FinFET, the work function metal layer 474 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The p-type work function metals may exemplarily include, but are not limited to, titanium nitride (TIN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal 476 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

One or more etching processes are performed to form contact openings extending though the ILD layer 465 to expose the source/drain epitaxial structures 456 and 458. Subsequently, source/drain contacts 480 are respectively formed in the contact openings. Formation of the source/drain contacts 480 includes, by way of example and not limitation, depositing one or more conductive materials overfilling the contact openings, and then performing a CMP process to remove excessive conductive materials outside the contact openings.

In some embodiments, metal alloy layers 485 are respectively formed above the source/drain epitaxial structures 456 and 458 prior to forming the source/drain contacts 480. The metal alloy layers 485, which may be silicide layers, are respectively formed in the contact openings and over the exposed source/drain epitaxial structures 456 and 458 by a self-aligned silicide (salicide) process. The silicide process converts the surface portions of the source/drain epitaxial structures 450 and 455 into the silicide contacts. Silicide processing involves deposition of a metal that undergoes a silicidation reaction with silicon (Si). In order to form silicide contacts on the source/drain epitaxial structures 456 and 458, a metal material is blanket deposited on the source/drain epitaxial structures 456 and 458. After heating the wafer to a temperature at which the metal reacts with the silicon of the source/drain epitaxial structures 456 and 458 to form contacts, unreacted metal is removed. The silicide contacts remain over the source/drain epitaxial structures 456 and 458, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 485 may include germanium.

In FIG. 7, a detector 110 is formed over the sensing region 407 of the substrate 410, and transistors 140a-140g are formed over the circuit region 409 of the substrate 410. For clarity, the transistors 140b-140f are not shown in FIG. 7. It is noted that in FIG. 7, the detector 110 is a transistor, which is for illustrative purposes only and not intended to be limiting beyond what is specifically recited in the claims. It can be appreciated that the detector 110 can be any device or circuit that can detect the intensity of e-beam light through the sensing pad 120 (see FIG. 8). In some embodiments, a control circuit (e.g., the control circuit 150 in FIG. 1) is formed over the circuit region 409 of the substrate 410.

Figure 8:
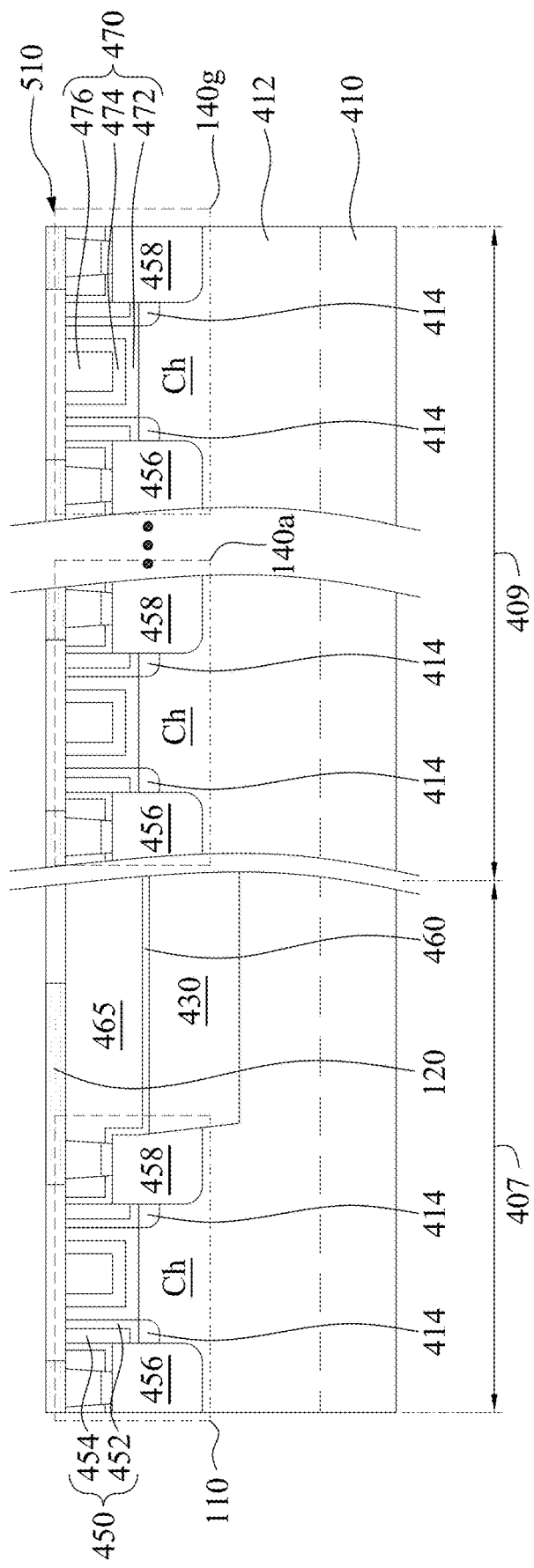

Reference is made to FIG. 8. A multilayer interconnection (MLI) structure MLI (see FIG. 13) is formed over the structure of FIG. 7. Specifically, as shown in FIG. 8, a bottom metallization layer 510 is formed over the structure of FIG. 7. The bottom metallization layer 510 include one or more horizontal interconnects, such as a sensing pad 120 and other metal lines, respectively extending horizontally or laterally in the bottom metallization layers. The sensing pad 120 is electrically connected to the detector 110 as shown in FIG. 8. It is noted that in FIG. 8, the sensing pad 120 is electrically connected to the source/drain epitaxial structure 458 of the detector 110, which is for illustrative purposes only and not intended to be limiting beyond what is specifically recited in the claims. It can be appreciated that the sensing pad 120 can be electrically connected to the source/drain epitaxial structure 456 or the gate structure 470 in some other embodiments. Further, the bottom metallization layer 510 (and/or the middle metallization layers 520 as shown in FIG. 12) may include metal lines that interconnect the gate structures 470 of the transistors 140a-140g and the control circuit.

Figure 9:
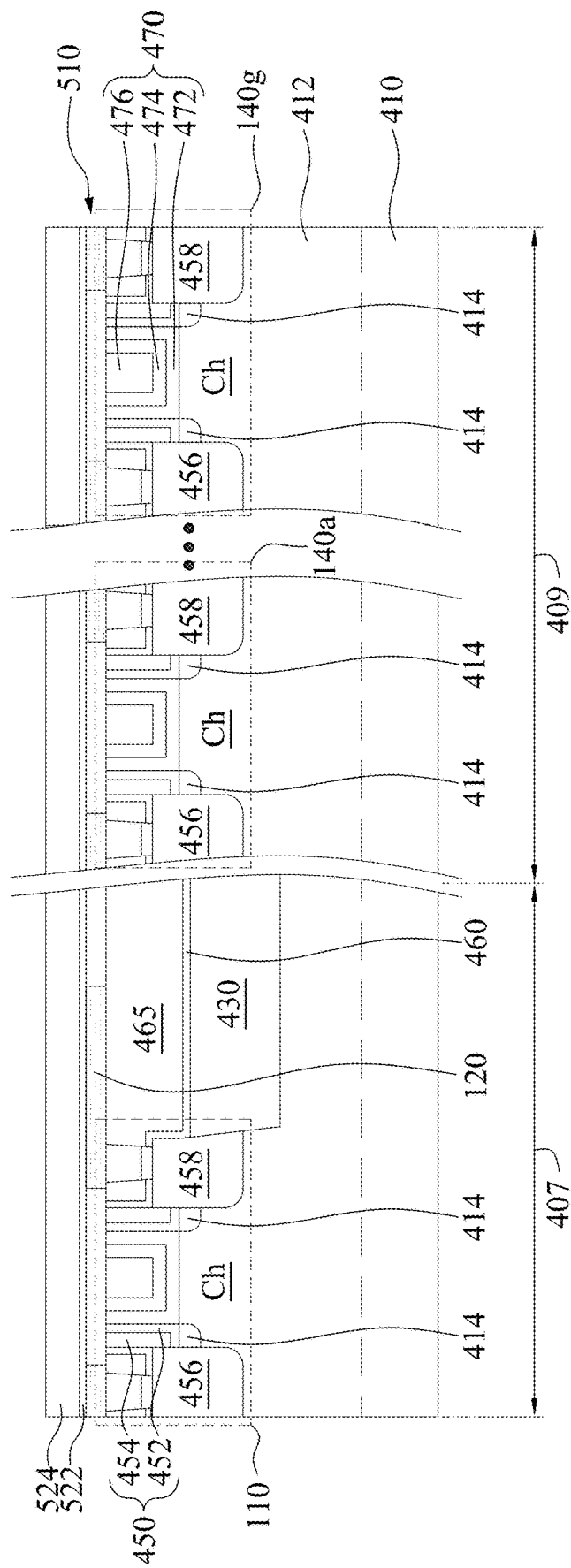
Figure 10:
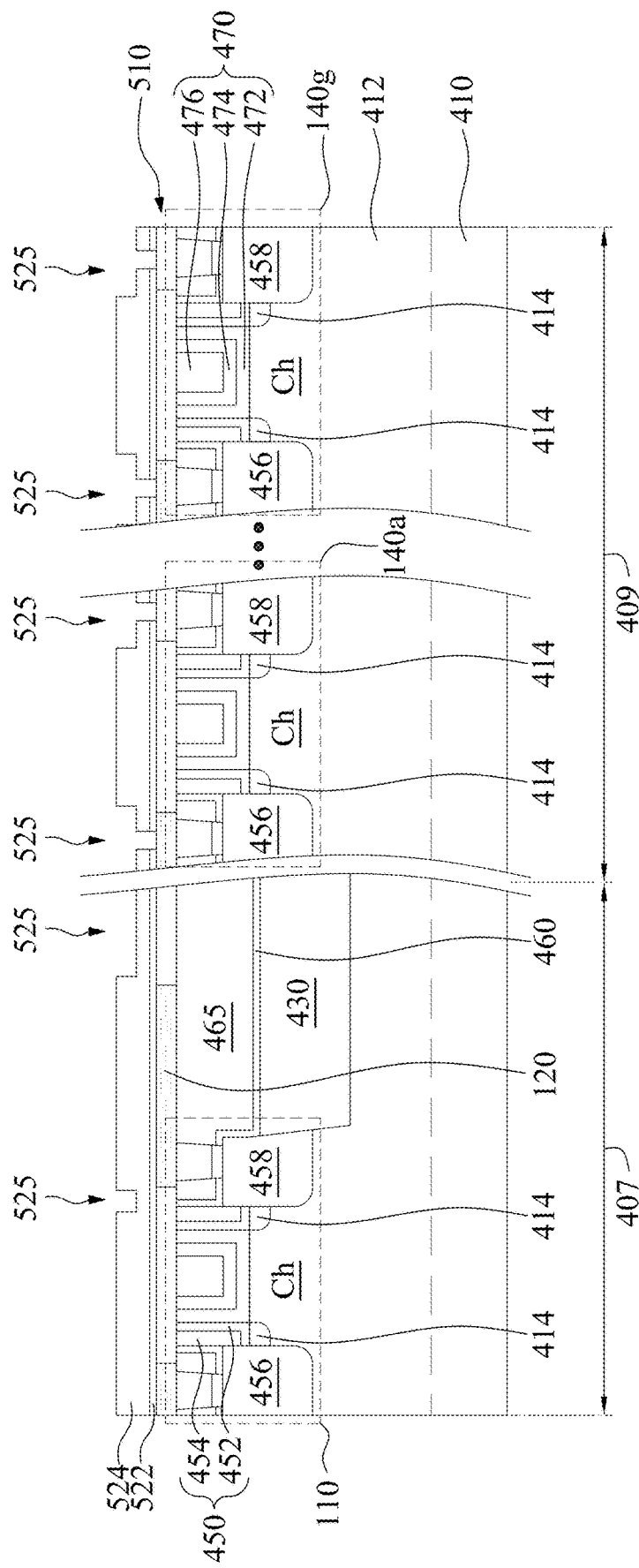
Figure 11:
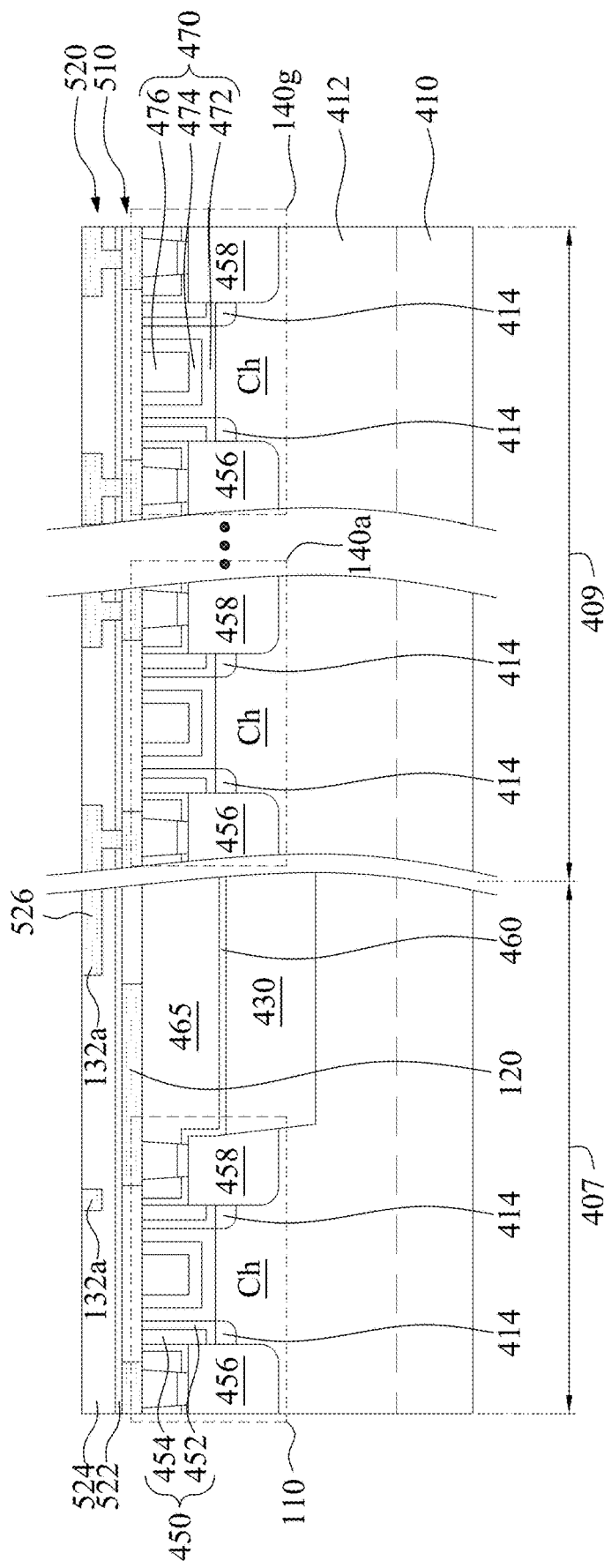

Reference is made to FIGS. 9-11. A middle metallization layer 520 is formed over the structure of FIG. 8. The middle metallization layer 520 includes an inter-metal dielectric (IMD) layer 524 and an etch stop layer 522. The middle metallization layer 520 include one or more horizontal interconnects, such as a conductive ring 132a, an interconnect element 526, and other metal lines, respectively extending horizontally or laterally in the IMD layer 524 and vertical interconnects respectively extending vertically in the IMD layer 524 and pass through the etch stop layer 522. As shown in FIG. 11, the conductive ring 132a is formed directly above the sensing pad 120 and is electrically connected to the source/drain epitaxial structure 456 of the transistor 140a via the interconnect element 526 and the metal lines above the transistor 140a.

In some embodiments, as shown in FIG. 9, the etch stop layer 522 and the IMD layer 524 are sequentially deposited on the bottom metallization layer 510, such that the etch stop layer 522 is in contact with the sensing pad 120 and the IMD layer 524. Openings 525 are then formed in the IMD layer 524 (and the etch stop layer 522) as shown in FIG. 10. Subsequently, conductive materials are filled in the openings 525 to form the conductive ring 132a, the interconnect element 526, and other metal lines and vertical interconnects as shown in FIG. 11. Therefore, the conductive ring 132a is separated from the sensing pad 120 by the IMD layer 524. As shown in FIG. 11, the conductive ring 132a surrounds a portion of the IMD layer 524, which is (entirely) non-conductive (or substantially metal-free in some embodiments). That is, a space surrounded by the conductive ring 132a is (entirely) non-conductive (or substantially metal-free in some embodiments).

Figure 12:
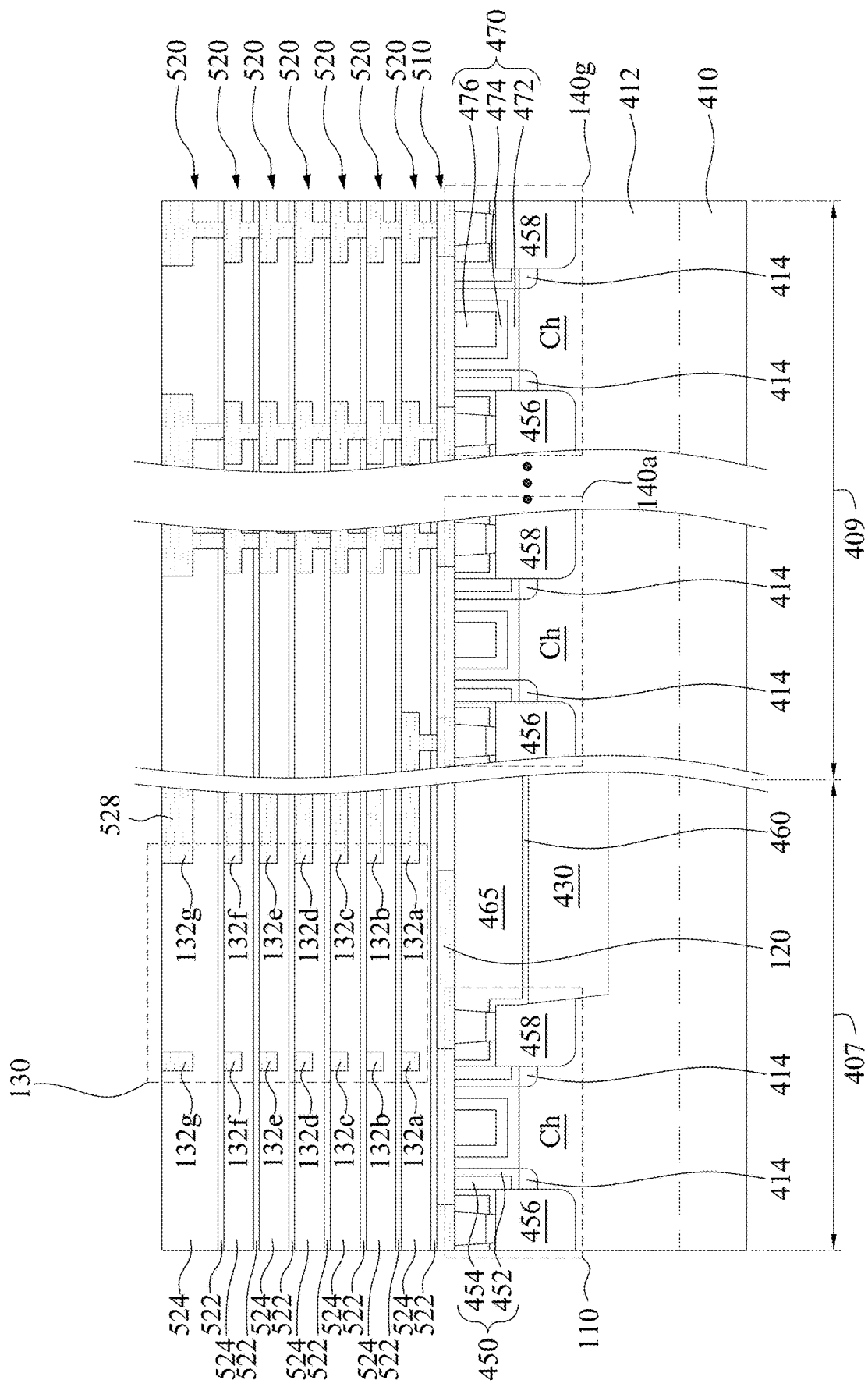

Reference is made to FIG. 12. Other middle metallization layers 520 are formed over the structure of FIG. 11. Hence, the conductive rings 132b-132g are formed in the middle metallization layers 520 and directly above the sensing pad 120 to form a ring structure 130. Each of the conductive rings 132b-132g is electrically connected to the source/drain epitaxial structures 456 of the transistors via individual interconnect lines and the metal lines above the transistors. For example, as shown in FIG. 12, the conductive ring 132g is electrically connected to the source/drain epitaxial structure 456 of the transistor 140g via the interconnect element 528 and the metal lines above the transistor 140g. Further, some of the horizontal interconnects and vertical interconnects are formed over the source/drain epitaxial structures 455 of the transistors 140a-140g. As shown in FIG. 12, there is no metal materials in the space surrounded by each of the conductive rings 132a-132g. That is, dielectric materials (e.g., the materials of the IMD layers 524) are filled in the space surrounded by each of the conductive rings 132a-132g. As shown in FIG. 12, each of the conductive rings 132b-132g surrounds a portion of the IMD layer 524, which is (entirely) non-conductive (or metal-free in some embodiments). That is, a space surrounded by each of the conductive rings 132b-132g is (entirely) non-conductive (or metal-free in some embodiments).

Figure 13:
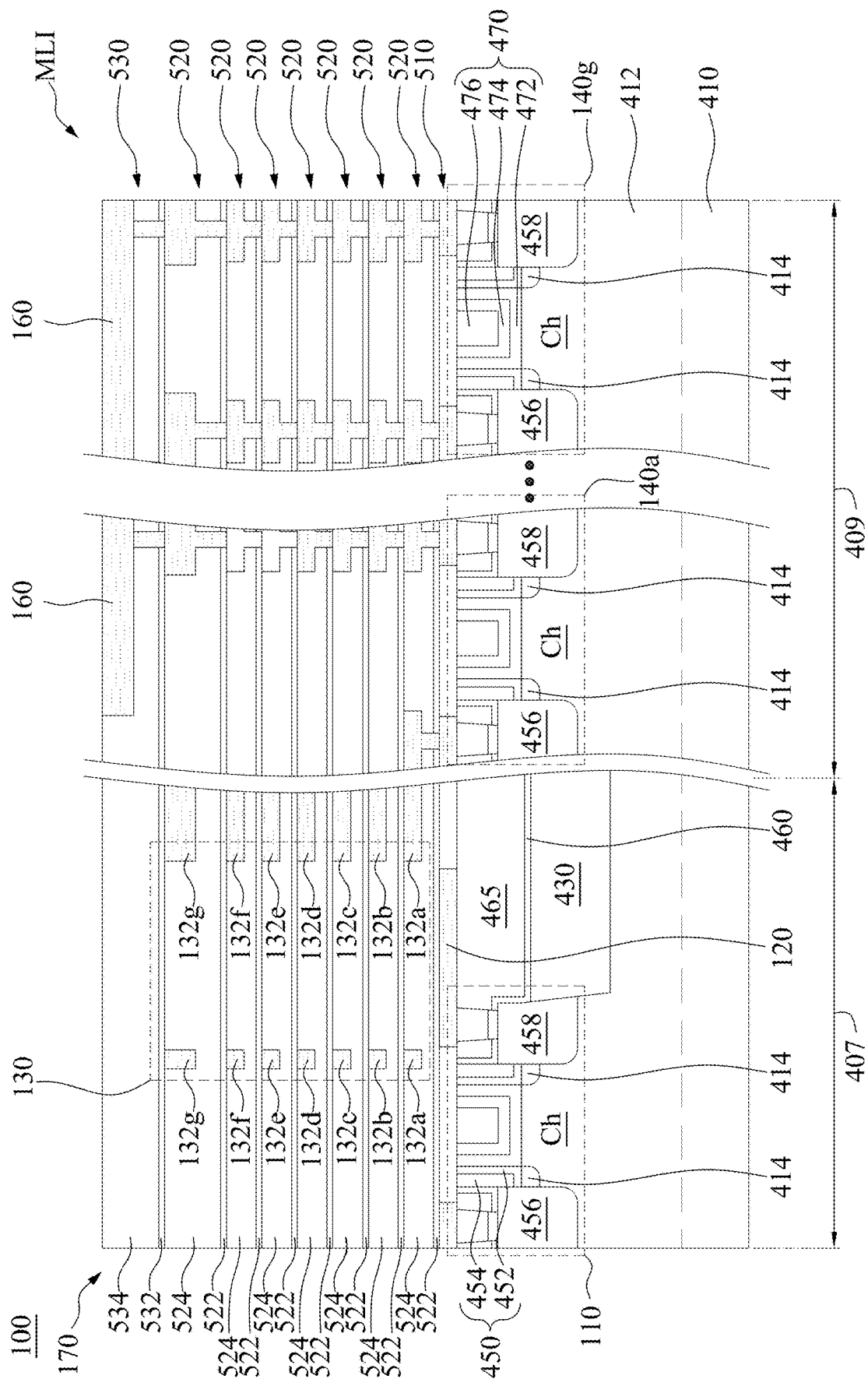

Reference is made to FIG. 13. A top metallization layer 530 is formed over the structure of FIG. 10. The top metallization layer 530 includes an inter-metal dielectric (IMD) layer 534 and an etch stop layer 532. The top metallization layer 530 include one or more horizontal interconnects, such as a power line 160 extending horizontally or laterally in the IMD layer 534 and vertical interconnects respectively extending vertically in the IMD layer 534 and pass through the etch stop layers 532. As shown in FIG. 13, the power line 160 is electrically connected to the source/drain epitaxial structure 455 of the transistor (e.g., the transistors 140a-140g). The power line 160 can be a ground line.

In some embodiments, the ring structure 130, the sensing pad 120, the power line 160, other horizontal interconnectors, and vertical interconnectors can be formed using, for example, a single damascene process, a dual damascene process, the like, or combinations thereof. In some embodiments, the IMD layers 524 and 534 may include low-k dielectric materials having k values, for example, lower than about 4.0 or even 2.0 disposed between such conductive features. In some embodiments, the IMD layers 524 and 534 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. In some embodiments, the etch stop layers 522 and 532 may be formed of $SiN_x$, SiCN, $SiO_2$, CN, $AlO_xN_y$, combinations thereof, or the like, deposited by CVD or PECVD techniques. In some embodiments, the IMD layer 524, 534 and the etch stop layers 522, 532 are together referred to as a dielectric structure 170. The ring structure 130, the sensing pad 120, the power line 160, other horizontal interconnectors, and vertical interconnectors may include metal materials such as copper, aluminum, tungsten, combinations thereof, or the like. In some embodiments, the ring structure 130, the sensing pad 120, the power line 160, other horizontal interconnectors, and vertical interconnectors may further include one or more barrier/adhesion layers (not shown) to protect the respective IMD layers 524 and 534 from metal diffusion (e.g., copper diffusion) and metallic poisoning. The one or more barrier/adhesion layers may include titanium, titanium nitride, tantalum, tantalum nitride, or the like, and may be formed using physical vapor deposition (PVD), CVD, ALD, or the like.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the ring structure can focus the e-beam light to the sensing pad and improve the scattering issues of the e-beam light. Another advantage is that the ring structure can be formed in the MLI layer without additional manufacturing process. In addition, during the detecting process, the detected e-beam light can be used to pre-charge the ring structure. That is, the ring structure can be charged without additional power source.

According to some embodiments, a device includes a detector, a sensing pad, a ring structure, a control circuit, a first transistor, and a second transistor. The sensing pad is electrically connected to the detector. The ring structure is over the sensing pad and includes an upper conductive ring and a lower conductive ring between the upper conductive ring and the sensing pad. The first transistor interconnects the upper conductive ring and the control circuit. The second transistor interconnects the lower conductive ring and the control circuit.

According to some embodiments, a method includes forming a detector, a first transistor, and a second transistor over a substrate; forming a sensing pad over the substrate and electrically connected to the detector, forming a ring structure over the sensing pad but electrically isolated from the sensing pad, including forming a lower conductive ring directly over the sensing pad; and forming an upper conductive ring directly over the lower conductive ring; forming interconnect elements over the substrate to interconnect the upper conductive ring and the first transistor and interconnect the lower conductive ring and the second transistor, respectively; and forming a power line over the substrate and connected to the first transistor and the second transistor.

According to some embodiments, a method includes initializing a ring structure comprising an upper conductive ring and a lower conductive ring; after initializing the ring structure, floating the ring structure; after floating the ring structure, pre-charging the upper conductive ring; projecting a first e-beam light to a sensing pad through the upper conductive ring and the lower conductive ring, wherein the ring structure is over the sensing pad and the lower conductive ring is between the upper conductive ring and the sensing pad; and detecting an intensity of the first e-beam light project on the sensing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a detector;
   a sensing pad electrically connected to the detector;
   a ring structure over the sensing pad, wherein the ring structure comprises:
     an upper conductive ring; and
     a lower conductive ring between the upper conductive ring and the sensing pad;
   a control circuit;
   a first transistor interconnecting the upper conductive ring and the control circuit; and
   a second transistor interconnecting the lower conductive ring and the control circuit.

2. The device of claim 1, wherein the upper conductive ring is electrically isolated from the lower conductive ring.

3. The device of claim 1, further comprising a power line connected to sources of the first transistor and the second transistor.

4. The device of claim 1, wherein a drain of the first transistor is electrically connected to the upper conductive ring.

5. The device of claim 1, wherein a radius of the upper conductive ring is greater than a radius of the lower conductive ring.

6. The device of claim 1, wherein an axis of the upper conductive ring passes through a sensing surface of the sensing pad.

7. The device of claim 1, wherein a distance between the upper conductive ring and the lower conductive ring is substantially the same as a distance between the lower conductive ring and the sensing pad.

8. The device of claim 1, wherein a ratio of a layout area of the lower conductive ring to an area of a sensing surface of the sensing pad is in a range between about 1 to about 5.

9. The device of claim 1, further comprising a dielectric structure covering the ring structure and the sensing pad.

10. The device of claim 1, wherein a space surrounded by the upper conductive ring is entirely non-conductive.

11. A method comprising:
    forming a detector, a first transistor, and a second transistor over a substrate;
    forming a sensing pad over the substrate and electrically connected to the detector;
    forming a ring structure over the sensing pad but electrically isolated from the sensing pad, comprising:
      forming a lower conductive ring directly over the sensing pad; and
      forming an upper conductive ring directly over the lower conductive ring;
    forming interconnect elements over the substrate to interconnect the upper conductive ring and the first transistor and interconnect the lower conductive ring and the second transistor, respectively; and
    forming a power line over the substrate and connected to the first transistor and the second transistor.

12. The method of claim 11, wherein forming the lower conductive ring comprises:
    depositing a first dielectric layer over the sensing pad;
    forming an opening in the first dielectric layer; and
    depositing conductive materials in the opening of the first dielectric layer to form the lower conductive ring, wherein the lower conductive ring is separated from the sensing pad by the first dielectric layer.

13. The method of claim 12, wherein forming the upper conductive ring further comprises:
    depositing an etch stop layer over the sensing pad prior to depositing the first dielectric layer, wherein the etch stop layer is in contact with the sensing pad and the first dielectric layer after depositing the first dielectric layer.

14. The method of claim 12, wherein forming the upper conductive ring comprises:
    depositing a second dielectric layer over the lower conductive ring;
    forming an opening in the second dielectric layer; and
    depositing conductive materials in the opening of the second dielectric layer to form the upper conductive ring, wherein the upper conductive ring is separated from the lower conductive ring by the second dielectric layer.

15. The method of claim 14, wherein forming the upper conductive ring further comprises:
    depositing an etch stop layer over the lower conductive ring prior to depositing the second dielectric layer, wherein the etch stop layer is in contact with the lower conductive ring and the second dielectric layer after depositing the second dielectric layer.

16. The method of claim 11, wherein the upper conductive ring and the lower conductive have substantially the same thickness.

17. The method of claim 11, wherein materials surrounded by the upper conductive ring is substantially metal-free.

18. A method comprising:
    initializing a ring structure comprising an upper conductive ring and a lower conductive ring;
    after initializing the ring structure, floating the ring structure;

after floating the ring structure, pre-charging the upper conductive ring;

projecting a first e-beam light to a sensing pad through the upper conductive ring and the lower conductive ring, wherein the ring structure is over the sensing pad and the lower conductive ring is between the upper conductive ring and the sensing pad; and detecting an intensity of the first e-beam light projecting on the sensing pad.

19. The method of claim 18, further comprising:

turning on a detector to detect the intensity of the first e-beam light after pre-charging the upper conductive ring.

20. The method of claim 18, wherein pre-charging the upper conductive ring comprises providing a second e-beam light to the ring structure, wherein the second e-beam light has an intensity lower than an intensity of the first e-beam light.

* * * * *